(12) United States Patent
Evans et al.

(10) Patent No.: US 7,352,214 B2
(45) Date of Patent: Apr. 1, 2008

(54) SYSTEM AND METHOD FOR CLOCK DETECTION WITH GLITCH REJECTION

(75) Inventors: Richard J. Evans, Clifton (GB); Martin G. Vickers, Cotham (GB); Simon T. Smith, Westbury-on-Trym (GB)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 11/058,212

(22) Filed: Feb. 16, 2005

(65) Prior Publication Data
US 2006/0071692 A1   Apr. 6, 2006

Related U.S. Application Data

(60) Provisional application No. 60/616,121, filed on Oct. 6, 2004.

(51) Int. Cl.
*G01R 19/00* (2006.01)

(52) U.S. Cl. .......................................... 327/18; 327/48
(58) Field of Classification Search ..................... None
See application file for complete search history.

(56) References Cited

U.S. PATENT DOCUMENTS 4,197,502 A * 4/1980 Sumner et al. ............. 375/316
6,008,655 A * 12/1999 Kuroda ....................... 324/537

* cited by examiner

*Primary Examiner*—Cassandra Cox
(74) *Attorney, Agent, or Firm*—Sterne, Kessler, Goldstein & Fox PLLC

(57) ABSTRACT

A system and a method are presented for detecting the presence of at least one clock signal of a defined clock frequency applied to at least one input port of an integrated circuit system, wherein the a first number M of clock pulses related to the at least one clock signal within a predefined cycle period is counted and the counted first number M of clock pulses is compared with a reference number. Depending on the result of the comparison the presence of the at least one clock signal is detected or not.

18 Claims, 1 Drawing Sheet

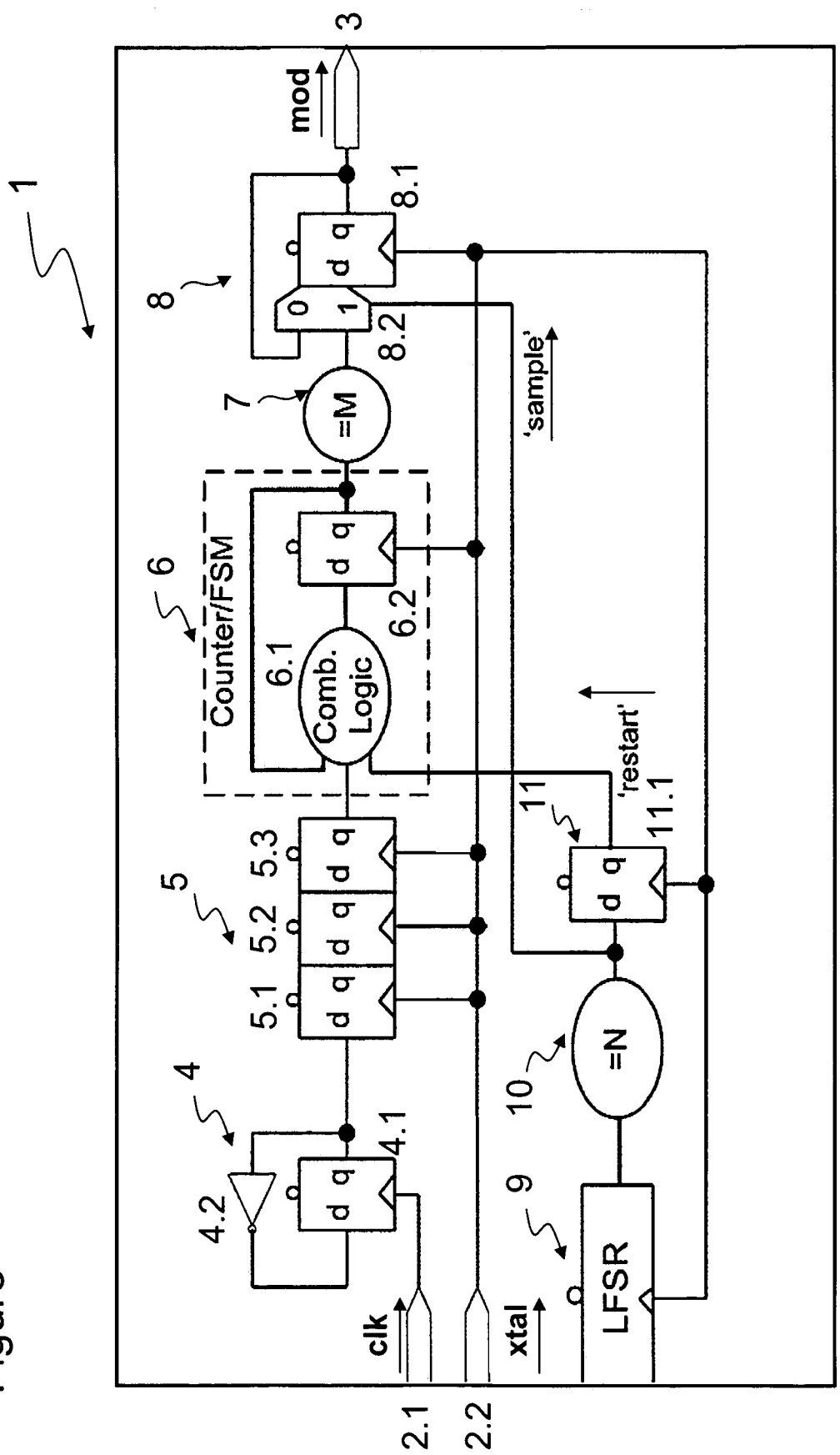
Figure

SYSTEM AND METHOD FOR CLOCK DETECTION WITH GLITCH REJECTION

This application claims benefit to U.S. Provisional Patent Application No. 60/616,121, filed Oct. 6, 2004, which is incorporated herein by reference in its entirety.

FIELD OF THE INVENTION

The present invention relates generally to a system and method for detection the presence of at least one clock signal and more specifically to an integrated circuit device wherein a system and a method for detecting a running clock of a specific frequency on one of the input ports of the integrated circuit is implemented.

BACKGROUND OF THE INVENTION

Analogue Front End (AFE) Integrated Circuits (IC), especially designed within a VDSL-Technology based product like the BCM6505 produced by Broadcom Corporation in Irvine, Calif., require in at least one of their operation modes a clock detection circuit to detect a running clock on one of its input ports ("ctrlClk").

If a clock signal with a predefined clock frequency is detected, the input port is used as the clock source for one of the internal blocks in preference to the default clock source ("dataClk").

If this additional operation is not required, the input ports for this specific clock signal resp. the "ctrlClk" pin of the input port of the AFE integrated circuit will—by way of example—be tied off to the logic value '0' on the integrated circuit board. However, crosstalk effects might glitch onto the tied off pin and make it appear to a state of the art clock detector circuit than a clock signal is applied to said "ctrlClk" input port of the of the AFE integrated circuit.

Therefore, what is needed is a system and method that will detect more precisely and trustfully whether a clock signal is applied to a defined import port of an integrated circuit system or whether the signals, which are detected via a clock detector circuit, are only due to crosstalk effects.

Further limitations and disadvantages of conventional and traditional approaches will become apparent to one of skill in the art, through comparison of such systems with the present invention as set forth in the remainder of the present application with reference to the drawings.

SUMMARY OF THE INVENTION

According to the present invention, these objects are achieved by a system and method as defined in the claims. The dependent claims define advantageous and preferred embodiments of the present invention.

The present idea refers to a method for detecting the presence of at least one clock signal of a defined clock frequency applied to at least one input port of an integrated circuit system, the method comprising the steps of: counting a first number of clock pulses related to the at least one clock signal within a predefined cycle period; and comparing the first number of clock pulse with a reference number, wherein depending on the result of the comparison the presence of the at least one clock signal is detected or not.

Additionally the present idea refers to an integrated circuit system for detecting the presence of at least one clock signal of a defined clock frequency at at least one input port of said integrated circuit system, the system comprising a counter unit for counting a first number of clock pulses related to the at least one clock signal within a predefined cycle period; and a comparison unit for comparing the first number of clock pulse with a reference number, wherein depending on the result of the comparison the presence of the at least one clock signal is detected or not.

The system and method of the present invention advantageously increase the reliability of the detection of a defined clock signal within an integrated circuit system.

These and other advantages, aspects and novel features of the present invention, as well as details of an illustrated embodiment thereof, will be more fully understood from the following description and drawings.

BRIEF DESCRIPTION OF THE DRAWING

The accompanying drawing, which is incorporated herein and form a part of the specification, illustrate the present invention and, together with the description, further serves to explain the principles of the invention and to enable a person skilled in the pertinent art to make and use the invention.

DETAILED DESCRIPTION OF THE INVENTION

The present invention will now be described in detail with reference to a preferred embodiment thereof as illustrated in the accompanying drawing. In the following description, numerous specific details are set forth in order to provide a thorough understanding of the present invention. It will be apparent, however, to one skilled in the art, that the present invention may be practiced without some or all of these specific details.

Referring now to the FIGURE, there is shown a schematic block diagram of an integrated circuit system 1 for detecting a clock signal 2, which is applied to at least one input port 2.1, 2.2 of an the integrated circuit system 1. The FIGURE shows in detail by way of example only a part of a complete integrated circuit system 1, e.g. the clock detection block of an integrated circuit system 1. In one embodiment, the present invention is implemented in a BCM 6505, produced by Broadcom Corporation in Irvine, Calif., and used as a VDSL analogue Front End (AFE) Integrated Circuit.

The system 1 comprises a first stage unit 4, a delay circuit 5 to address metastability issues in capturing data across clock domains, a finite state machine (FSM) unit 6, a first comparison unit 7, a second stage unit 8, a linear feedback shift register (LFSR) unit 9, a second comparison unit 10 and a third stage unit 11. Furthermore the integrated circuit system 1 consists of a first input port 2.1 and a second input port 2.2 as well as a first output port 3.

The first input port 2.1 is connected to the first stage unit 4, which in turn is associated with the delay unit 5. The delay unit 5 is attached to the second input port 2.2 and the FSM unit 6. The FSM unit 6 is also connected to the second input port 2.2 and to the first comparison unit 7, which is aligned with the second stage unit 8. The second input port 2.2 is additionally attached to the second stage unit 8, the LFSR unit 9 and the third stage unit 11.

The first stage unit 4 is by way of example formed by a divider circuit 4, which divides an input signal by a predetermined number, e.g. 2. Thereto the divider circuit shows a Flip-Flop-device 4.1, which has at least one input port and at least one output port and one clock input port. The at least one output port is connected via an inverter unit 4.2 to the at least one input port and the clock input port is connected to the first input port 2.1 of the system 1.

The delay circuit 5—presented in the FIGURE—is realized via a serial connection of a predefined number of Flip-Flop-devices, e.g. three Flip-Flop-devices 5.1-5.3, wherein the at least one output port of the Flip-Flop-device 4.1 of the first stage unit 4 is connected to an import port of the delay circuit 5 resp. a first Flip-Flop-device 5.1 and the output port of the delay circuit 5 resp. a third Flip-Flop-device 5.3 is connected to the FSM unit 6. Also the clock input port of the first, second and third Flip-Flop-device 5.1, 5.2, 5.3 is connected to the second input port 2.2 of the system 1.

Additionally the FSM unit 6, which could also be realized via a counter, is formed by a combination logic unit 6.1 and a Flip-Flop-device 6.2, wherein the combination logic unit 6.1 has at least three input ports and at least one output port. The output port of the combination logic unit 6.1 is connected to the input port of the Flip-Flop-device 6.2, whose output port is connected backwards to one of the input ports of the combination logic unit 6.1. The other two input ports of the combination logic unit 6.1 are aligned to the output port of the delay circuit 5 and the output port of the third stage unit 11. Also the clock input port of the Flip-Flop-device 6.2 is connected to the second input port 2.2 of the system 1.

The second stage unit 8 is implemented for example via a Flip-Flop-device 8.1 and an additional logic unit 8.2, where the clock input port of the Flip-Flop-device 8.1 is connected to the second input port 2.2. One of the input ports of the additional logic unit 8.2 is attached to the output port of the Flip-Flop-device 8.1 and the other two input ports of the additional logic unit 8.2 are connected to the output ports of the first and second comparison unit 7, 10.

Also the third stage unit 11 comprises a Flip-Flop-device 11.1, where the input port of the Flip-Flop 11.1 is connected to the output port of the second comparison unit 10 and the output port of the Flip-Flop-device 11.1 is attached to the input port of the combination logic unit 6.1 of the FSM unit 6. The clock input port of the Flip-Flop-device 11.1 is associated with the second input port 2.2 of the system 1.

The presented system 1 is able to signal on its output port 3 via a logic value "1" that a clock signal clk is applied to the first input port 2.1 by counting the clock pulses of the clock signal clk over a set period. Then the result of the calculation process is compared with a hard coded lower bound. Only clock frequencies within these bounds are recognized and cause the detection circuit of the system 1 to output a logic value '1' via its output port 3 as output signal mod. In an alternative embodiment the result is compared with a hard coded upper bound. The circuit shown in the FIGURE is by way of example configured only to compare a counted value against a lower bound, as also implemented in the AFE Integrated Circuit BCM 6505.

On an initial reset of the system 1, all Flip-Flop-devices 4.1, 5, 6.2, 8.1, 11.1 and the state machine unit 6 are zeroed, which causes the output signal mod to output the logic value "0". All asynchronous resets are connected to a global reset of the described system 1 (not depicted in the FIGURE). The Linear LFSR unit 9 is configured for a maximal sequence length and modified to allow all zeroes state for reset.

The incoming clock signal clk is divided via the divider circuit 4, which effectively divides the frequency of the clock signal 4 being measured by 2. Additionally a reference clock signal xtal is applied to the second input port 2.2 of the system 1, where reference clock signal xtal may be implemented as a non interruptible clock source.

The divided clock is passed through a delay circuit which addresses any metastability issues which would arise on crossing clock domains when an edge of the captured clock (in this case the output of the device 4.1) occurs at exactly the same instant as the capturing clock's active edge (here, the net connected to port 2.2, xtal).

A period of N cycles of the reference clock signal xtal is used to count pulses of the clock signal clk. This period is defined by the Linear Feedback Shift Register (LFSR) unit 6. A conventional counter circuit might be substituted for the LFSR if required, but the LFSR unit 6 has the advantage of being smaller in dimension and there is the preferable implementation for example in the AFE Integrated Circuit BCM 6505. The LFSR unit 6 is specially modified to allow the all-zeroes state to be traversed. So the measurement period is equal to N cycles of the reference clock signal xtal.

After N cycles of the reference clock signal xtal, the number of the clock signal clk pulses counted is compared with a minimum value M[min]. To count M[min] cycles of the input clock signal clk the following equation is implemented:

$$N/f(xtal) >= M[min]*2/f(clk),$$

wherein the shortcut f(x) represents for the frequency of the different clock signals. In an alternative embodiment the number of the clock signal clk pulses counted is also compared with a maximum value M[max].

Since the clock signal clk is effectively divided by 2 the number N of cycles of the reference clock xtal can be set for which the LFSR unit 6 must count and the number of pulses M of the clock signal clk should show a value within the following area $$M[max]*2/f(clk) < N/f(xtal) > M[min]*2/f(clk)$$

The number of pulses M will always be >>1 or else a single glitch would trigger the output port 3. Using a number of pulses M=4 has shown good results.

The second comparison unit 10 detects one arbitrary state of the LFSR unit 9. If the arbitrary state is detected, a first test signal 'sample' is set via the second comparison unit 10 to the logic value "1" ("high") for one clock cycle period only. Also the second test signal 'restart' is set via the third stage unit 11 to the logic value "1" ("high") in the following clock cycle period for one clock cycle only.

By applying the second test signal 'restart' having a logic value "1" to the combination logic 6.1 of the FSM unit or Counter 6, the FSM unit or Counter 6 is zeroed. The counter/FSM unit 6 counts incoming pulses on subsequent clock cycles. If the logic value of the first test signal 'sample' is "1" ("high") the output of the first comparison unit 7 is sampled into the second stage unit 8, more precisely into the input port of the additional logic unit 8.2.

If the number of counted pulses of the clock signal clk is at least equal to M pulses or even more pulses have been counted, the output signal 'mode' is set to the logic value "1" ("high") and is outputted at the output port 3 of the system 1. So if the required number M of pulses have been collected the output signal 'mode' is set to '1', otherwise the output signal 'mode' is always '0'.

If a clock signal with a predefined clock frequency is detected, the input port is used as the clock source for one of the internal blocks in preference to the default clock source.

After N+1 cycles the circuit resets itself ready to begin another period of counting clock pulses of the clock signal clk applied to the first input port 2.1 of the system1.

While the invention has been described with reference to certain embodiments, it will be understood by those skilled in the art that various changes may be made and equivalents may be substituted without departing from the scope of the invention. In addition, many modifications may be made to adapt a particular situation or material to the teachings of the invention without departing from its scope. Therefore, it is intended that the invention not be limited to the particular embodiment disclosed, but that the invention will include all embodiments falling within the scope of the appended claims.

What is claimed is:

1. A method for detecting the presence of at least one clock signal of a defined clock frequency applied to at least one input port of an integrated circuit system, the method comprising the steps of:
    counting a first number M of clock pulses related to the at least one clock signal within a predefined cycle period based on a reference clock signal that is applied to an independent input port of the integrated circuit system; and
    comparing the counted first number M of clock pulses with at least one reference number, wherein depending on the result of the comparison the presence of the at least one clock signal is detected or not.

2. A method according to claim 1, wherein said reference clock signal may be implemented as a non interruptible clock source.

3. A method according to claim 2, wherein said predefined cycle period is equal to N cycles of the reference clock signal.

4. A method according to claim 3, wherein said predefined cycle period of N cycles of the reference clock signal is defined by a Linear Feedback Shift Register (LFSR) unit.

5. A method according to claim 1, wherein said reference number is represented via a minimum value M[min] as a hard coded lower bound or a maximum value M[max] as a hard coded upper bound.

6. A method according to claim 1, including the step of determining the frequency of the at least one clock signal via the counted first number of clock pulses within the predefined cycle period.

7. A method according to claim 5, including the step of determining the number N of cycles of the reference clock signal via the following equation:
    N/f(xtal)>=M[min]*2/f(clk), wherein
    N represents number of cycles of the reference clock signal;
    M[min] represents said minimum value M[min];
    f(xtal) represents the frequency of the reference clock signal;
    f(clk) represents for the frequency of the at least one clock signals.

8. A method according to claim 5, including the step of determining the number N of cycles of the reference clock signal via the following equation:
    N/f(xtal)>M[min]*2/f(clk), wherein
    N represents number of cycles of the reference clock signal;
    M[min] represents said minimum value M[min];
    f(xtal) represents the frequency of the reference clock signal;
    f(clk) represents for the frequency of the at least one clock signals.

9. A method according to claim 1, including resetting the integrated circuit system after N+1 cycles of the reference clock signal.

10. An integrated circuit system for detecting the presence of at least one clock signal of a defined clock frequency applied to at least one input port of said integrated circuit system, the system comprising:
    a counter unit for counting a first number of clock pulses related to the at least one clock signal within a predefined cycle period based on a reference clock signal that is applied to an independent input port of the integrated circuit system; and
    a comparison unit for comparing the first number of clock pulse with a reference number, wherein depending on the result of the comparison the presence of the at least one clock signal is detected or not.

11. An integrated circuit system according to claim 10, wherein said counter unit comprises at least a first stage unit, a delay circuit, a finite state machine (FSM) unit, a linear feedback shift register (LFSR) unit, a second comparison unit and a third stage unit.

12. An integrated circuit system according to claim 10, wherein said comparison unit comprises a first comparison unit and a second stage unit.

13. An integrated circuit system according to claim 11, wherein said first stage unit comprises at least one Flip-Flop-device and at least one converter unit.

14. An integrated circuit system according to claim 11, wherein said delay unit consists of at least three Flip-Flop-devices.

15. An integrated circuit system according to claim 11, wherein said finite state machine (FSM) unit comprises at least one combination logic unit and at least one Flip-Flop-device.

16. An integrated circuit system according to claim 12, wherein said a second stage unit comprises at least one logic unit and at least one Flip-Flop-device.

17. An integrated circuit system according to claim 12, wherein the system comprises at least a first and second input port and at least one output port, wherein said at least one clock signal is applied to said first input port, a reference clock signal is applied to said second input port and at least one output signal is dispensed at said output port.

18. An integrated circuit system according to claim 17, wherein said output signal is set to the logic value "high" if the presence of the at least one clock signal is detected and is set to the logic value "low" if the presence of the at least one clock signal is not detected.

* * * * *